US008576018B2

(12) United States Patent
Czimmek et al.

(10) Patent No.: US 8,576,018 B2
(45) Date of Patent: Nov. 5, 2013

(54) SYNCHRONIZED ARRAY BRIDGE POWER OSCILLATOR

(75) Inventors: Perry Czimmek, Williamsburg, VA (US); Mike Hornby, Williamsburg, VA (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 0 days.

(21) Appl. No.: 13/332,517

(22) Filed: Dec. 21, 2011

(65) Prior Publication Data

US 2012/0268220 A1 Oct. 25, 2012

Related U.S. Application Data

(60) Provisional application No. 61/478,366, filed on Apr. 22, 2011.

(51) Int. Cl.

*H03B 5/12* (2006.01)
*B05B 1/24* (2006.01)
*H05B 6/02* (2006.01)

(52) U.S. Cl.

USPC ............. 331/117 R; 331/55; 331/46; 239/81; 239/130; 239/135; 219/600; 219/205

(58) Field of Classification Search

USPC ................ 331/50, 55, 59, 114, 108 A, 117 R, 331/117 FE, 46, 47, 167, 172; 363/16, 22, 363/21.03, 21.14; 219/628, 638, 661, 662, 219/624, 672, 660, 200, 201, 202, 205, 600, 219/635; 239/81, 128, 130, 135; 122/5.52

See application file for complete search history.

(56) References Cited

U.S. PATENT DOCUMENTS

| | | | | |
|---|---|---|---|---|
| 6,124,581 | A | 9/2000 | Ulrich | |
| 6,388,476 | B1 * | 5/2002 | Isobe et al. | 327/110 |
| 6,528,770 | B1 * | 3/2003 | Akel et al. | 219/624 |
| 7,628,340 | B2 | 12/2009 | Czimmek | |
| 7,677,468 | B2 | 3/2010 | Hornby et al. | |
| 8,143,954 | B2 * | 3/2012 | Bolz | 331/2 |
| 2004/0178680 | A1 | 9/2004 | Fishman et al. | |
| 2007/0221747 | A1 | 9/2007 | Hornby et al. | |
| 2007/0221761 | A1 | 9/2007 | Hornby et al. | |
| 2007/0221874 | A1 | 9/2007 | Hornby et al. | |
| 2007/0235086 | A1 | 10/2007 | Hornby et al. | |
| 2007/0235569 | A1 | 10/2007 | Hornby et al. | |
| 2008/0007361 | A1 * | 1/2008 | Fu | 331/167 |
| 2009/0290385 | A1 * | 11/2009 | Jungreis et al. | 363/17 |
| 2010/0202172 | A1 * | 8/2010 | Skirda et al. | 363/89 |

FOREIGN PATENT DOCUMENTS

| | | | |
|---|---|---|---|
| EP | 2073368 | A1 | 6/2009 |
| EP | 2148421 | A1 | 1/2010 |

OTHER PUBLICATIONS

International Search Report and Written Opinion dated May 23, 2012, from corresponding International Patent Application No. PCT/US2012/027991.

* cited by examiner

*Primary Examiner* — Ryan Johnson

(57) ABSTRACT

An electronic high frequency induction heater driver, for a variable spray fuel injection system, uses a scalable array of zero-voltage switching oscillators that utilize full and half-bridge topology wherein the semiconductor switches are synchronous within each bridge for function, and each bridge is synchronized for function along the entire array. The induction heater driver, upon receipt of a turn-on signal, multiplies a supply voltage through a self-oscillating series resonance, wherein one component of each tank resonator circuit comprises an induction heater coil magnetically coupled to an appropriate loss component so that fuel inside a fuel component is heated to a desired temperature.

10 Claims, 2 Drawing Sheets

SYNCHRONIZED ARRAY BRIDGE POWER OSCILLATOR

CROSS-REFERENCE TO RELATED APPLICATIONS

This application is a non-provisional of, and claims priority to the Apr. 22, 2011, filing date of, U.S. provisional patent application Ser. No. 61/478,366, entitled Synchronized Array Bridge Power Oscillator, the entire content of which is incorporated herein by reference.

And this application is related to the following U.S. non-provisional patent applications filed on the same day as this application:

Synchronous Full-Bridge Power Oscillator with Leg Inductors, invented by Perry Czimmek, and identified by Ser. No. 13/332,501;

Synchronous Full-Bridge Power Oscillator, invented by Perry Czimmek, and identified by Ser. No. 13/332,506;

Synchronized Array Power Oscillator with Leg Inductors, invented by Perry Czimmek and Mike Hornby, and identified by Ser. No. 13/332,521;

Variable Spray Injector with Nucleate Boiling Heat Exchanger, invented by Perry Czimmek and Hamid Sayar, and identified by Ser. No. 13/332,532; and Adaptive Current Limit Oscillator Starter, invented by Perry Czimmek, and identified by Ser. No. 13/332,539.

BACKGROUND

Embodiments of the invention relate generally to heated tip fuel injectors, and more particularly, to controlling and driving an induction-heated fuel injector.

There is a continued need for improving the emissions quality of internal combustion engines. At the same time, there is pressure to minimize engine crank times and time from key-on to drive-away, while maintaining maximum fuel economy. Those pressures apply to engines fueled with alternative fuels such as ethanol as well as to those fueled with gasoline.

During cold temperature engine start, the conventional spark ignition internal combustion engine is characterized by high hydrocarbon emissions and poor fuel ignition and combustibility. Unless the engine is already at a high temperature after stop and hot-soak, the crank time may be excessive, or the engine may not start at all. At higher speeds and loads, the operating temperature increases and fuel atomization and mixing improve.

During an actual engine cold start, the enrichment necessary to accomplish the start leaves an off-stoichiometric fueling that materializes as high tail-pipe hydrocarbon emissions. The worst emissions are during the first few minutes of engine operation, after which the catalyst and engine approach operating temperature. Regarding ethanol fueled vehicles, as the ethanol percentage fraction of the fuel increases to 100%, the ability to cold start becomes increasingly diminished, leading some manufacturers to include a dual fuel system in which engine start is fueled with conventional gasoline and engine running is fueled with the ethanol grade. Such systems are expensive and redundant.

Another solution to cold start emissions and starting difficulty at low temperature is to pre-heat the fuel to a temperature where the fuel vaporizes quickly, or vaporizes immediately ("flash boils"), when released to manifold or atmospheric pressure. Pre-heating the fuel replicates a hot engine as far as fuel state is considered.

A number of pre-heating methods have been proposed, most of which involve preheating in a fuel injector. Fuel injectors are widely used for metering fuel into the intake manifold or cylinders of automotive engines. Fuel injectors typically comprise a housing containing a volume of pressurized fuel, a fuel inlet portion, a nozzle portion containing a needle valve, and an electromechanical actuator such as an electromagnetic solenoid, a piezoelectric actuator or another mechanism for actuating the needle valve. When the needle valve is actuated, the pressurized fuel sprays out through an orifice in the valve seat and into the engine.

One technique that has been used in preheating fuel is to inductively heat metallic elements comprising the fuel injector with a time-varying magnetic field. Exemplary fuel injectors having induction heating are disclosed in U.S. Pat. No. 7,677,468, U.S. Patent Application Nos: 20070235569, 20070235086, 20070221874, 20070221761 and 20070221747, the contents of which are hereby incorporated by reference herein in their entirety. The energy is converted to heat inside a component suitable in geometry and material to be heated by the hysteretic and eddy-current losses that are induced by the time-varying magnetic field.

The inductive fuel heater is useful not only in solving the above-described problems associated with gasoline systems, but is also useful in pre-heating ethanol grade fuels to accomplish successful starting without a redundant gasoline fuel system.

Because the induction heating technique uses a time-varying magnetic field, the system includes electronics for providing an appropriate high frequency alternating current to an induction coil in the fuel injector.

Conventional induction heating is accomplished with hard-switching of power, or switching when both voltage and current are non-zero in the switching device. Typically, switching is done at a frequency near the natural resonant frequency of a resonator, or tank circuit. The resonator includes an inductor and capacitor that are selected and optimized to resonate at a frequency suitable to maximize energy coupling into the heated component.

The natural resonant frequency of a tank circuit is $fr=1/(2\pi\sqrt{LC})$, where L is the circuit inductance and C is the circuit capacitance. The peak voltage at resonance is limited by the energy losses of the inductor and capacitor, or decreased quality factor, Q, of the circuit. Hard-switching can be accomplished with what are called half-bridge or full-bridge circuits, comprising a pair or two pairs of semiconductor switches, respectively. Hard-switching of power results in the negative consequences of switching noise, and high amplitude current pulses at resonant frequency from the voltage supply, or harmonics thereof. Also, hard switching dissipates power during the linear turn-on and turn-off period when the switching device is neither fully conducting nor fully insulating. The higher the frequency of a hard-switched circuit, the greater the switching losses.

The preferred heater circuit therefore provides a method of driving a heated fuel injector wherein switching is done at the lowest possible interrupted power. This heater circuit was disclosed in U.S. Pat. No. 7,628,340, Title: Constant Current Zero-Voltage Switching Induction Heater Driver for Variable Spray Injection. Ideally, energy should be replenished to the tank circuit when either the voltage or the current in the switching device is zero. It is known that the electromagnetic noise is lower during zero-voltage or zero-current switching, and is lowest during zero-voltage switching, this is the method of U.S. Pat. No. 7,628,340. It is also known that the switching device dissipates the least power under zero switching. That ideal switching point occurs twice per cycle when the sine wave crosses zero and reverses polarity; i.e., when the sine wave crosses zero in a first direction from positive to negative, and when the sine wave crosses zero in a second direction from negative to positive.

It is preferable to reduce the size of inductive components and in some cases, eliminate the impedance-matching transformer, while maintaining the minimum necessary connections to the inductive heater coil on the injector. It is further preferable to reduce the overall quantity of components in repetitive function circuits by combining compatible functions of adjacent circuits. Embodiments of the invention continue to provide for the elimination of the hard-switching and its negative consequences, replace it with zero-voltage switching, and further apply this method in a full-bridge topology while advantageously eliminating the impedance matching transformer and overcoming the difficulties of alternative solutions.

The elimination of the impedance matching transformer and elimination of the center-tap of the induction heating coil such that only two conductors are used for transmission of power has been disclosed separately. Additionally, forced current sharing through the induction heating coil while allowing for flexibility and suitable inductance and ampere-turns of the induction heater coil has been disclosed separately.

BRIEF SUMMARY

Embodiments of the invention reduce the number of full-bridge semiconductor switches by replacing additional full-bridges with synchronized half-bridges and a corresponding reduced number of semiconductor switches. An embodiment of the invention uses two pairs of complimentary pairs of power switching transistors in a full-bridge, or H-bridge, configuration, subsequent complimentary pairs form half-bridges sharing the adjacent half-bridge to create a sequence of virtual full bridges synchronized with the original full-bridge power oscillator.

The deviations from a full-bridge driver are that the bridge has a resonant tank circuit disposed between bridges, replenishment of energy to the resonant tank circuit is accomplished globally from a constant-current inductor, and the load section of the conventional bridge is replaced with the resonant tank circuit. The oscillator-synchronous inherent zero-switching topology that drives the gates of the complimentary pairs of transistors in alternating sequence of diagonal pairs also deviates from a conventional full-bridge driver.

Additionally, the tank-replenishment current passes through each induction heater coil and a global constant-current inductor that either sources or sinks current.

DETAILED DESCRIPTION

Figure 1:
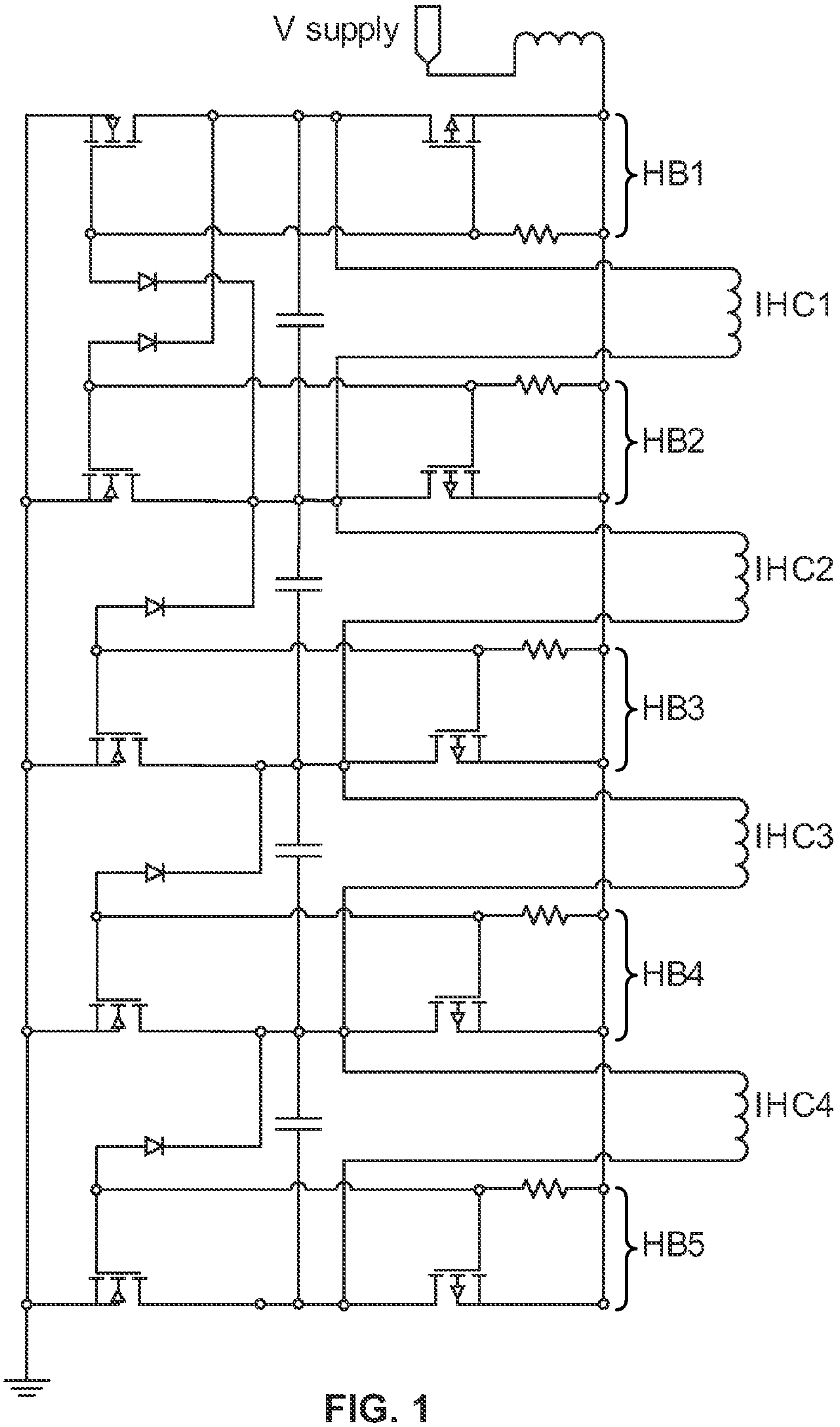
FIG. 1 is a simplified electrical schematic diagram showing a synchronized array comprised of a full H-bridge at the top and then cascading half-bridges and with a constant-current inductor supplying energy to the array, and without a transformer and without a center-tap inductive heater coil in accordance with embodiments of the invention.

Ideally, energy should be replenished to the tank circuit when either the voltage or the current in the switching device is zero. The electromagnetic noise is lower during zero-voltage or zero-current switching and is lowest during zero-voltage switching. The switching device dissipates the least power under zero switching. That ideal switching point occurs twice per cycle when the sine wave crosses zero and reverses polarity; i.e., when the sine wave crosses zero in a first direction from positive to negative, and when the sine wave crosses zero in a second direction from negative to positive.

Embodiments of the invention eliminate hard-switching and its negative consequences, and replace it with zero-voltage switching in a full-bridge configuration. The integrated functions of the synchronous full-bridge power oscillator heater driver of the invention will be explained with reference to FIG. 2, which is a simplified representation of a circuit in accordance with embodiments of the invention with many of the basic components not shown for clarity. Specific or general values, ratings, additions, inclusion or exclusion of components are not intended to affect the scope of the invention.

L1 may be located inside a fuel injector. L1 is an induction heater coil that provides ampere-turns for induction heating a suitable fuel-injector component.

A synchronous full-bridge power oscillator in accordance with embodiments of the invention may include R1, R2, D1, D2, Q1, Q2, Q3, Q4, L2, C1 and L1. Q1 and Q2 are enhancement-type N-MOSFET (N-channel Metal-Oxide-Semiconductor Field-Effect Transistor) switches that alternatively connect tank resonator, C1 and L1, circuit to ground and, when each is turned on in the respective state, enables current to flow through induction heater coil and ground. Q3 and Q4 are enhancement-type P-MOSFET (P-channel Metal-Oxide-Semiconductor Field-Effect Transistor) switches that alternatively connect tank resonator, C1 and L1, circuit to the voltage supply, which may be a power supply, or in the case of a vehicle, a battery or an alternator, and which is a source of potential energy to replenish energy lost in the oscillator. Replenishment current for the tank passes through L2, and with Q1 and Q2 in the appropriate state, enable current to flow through induction heater coil.

C1 and L1 are the tank resonator capacitor and tank resonator inductor, respectively, of a resonant tank circuit. The resonant frequency of the tank circuit is $fr=1/(2\pi\sqrt{LC})$, where L is the heater coil inductance L1, and C is the capacitance of tank capacitor C1. The peak voltage in the tank circuit is set by $V_{out}=\pi^*V_{in}$ where $V_{in}$ is the supply voltage. The current level in the tank circuit is determined from the energy balance of $$\frac{1}{2}LI^2=\frac{1}{2}CV^2.$$

The zero-switching power oscillator circuit is self-starting in oscillation, but may be forced into oscillation by selectively sequencing the switching of Q1-Q4 in a full-reversing H-bridge strategy. The complimentary pairs, or here, the pairs of transistors that are flowing current between the MOSFET 'drain' and 'source' at the same time are Q3 and Q2 or Q4 and Q1. It is not desirable to have Q1 flowing current when Q3 flows current, and likewise, it is not desirable to have Q2 flowing current when Q4 flows current. L2 provides this transient separation during state change of the H-bridge transistors. L2 additionally isolates the resonant tank from the voltage source. When Q3 is flowing current, current passes through the induction heater coil and then through Q2 to ground. When Q4 is flowing current, current passes through the induction heater coil in the reverse direction as when Q3 was flowing current, and then through Q1 to ground, this is 'full-reversal' of current.

A MOSFET is a device that has a threshold for an amount of Coulomb charge into the gate, which is drain-source current-dependent. Satisfying the charge threshold enhances the device into an 'on' state. First and second gate resistors R1, R2 supply the gate charging current to first and second legs of the H-bridge. R1 supplies current to gates of Q1 and Q3, R2 supplies current to the gates of Q2 and Q4, respectively, and R1, R2 limit the current flowing into first and second gate diodes D1, D2, respectively. Q3 and Q4, P-MOSFET conduct between drain and source when source is more positive than gate. Q1 and Q2, N-MOSFET conduct between drain and source when source is more negative than gate.

The loading caused by the resistive and hysteretic loss of the heated component reflects back as a loss in the resonant tank circuit. That loss is replenished by current flowing from current source inductor L2, from the voltage supply. Depending on the state of reversal of the H-bridge in which the current flows, the current will flow either through Q3 or Q4 and then through induction heater coil L1. L2 will supply current to the tank circuit from the energy stored in the magnetic field. That energy is replenished from the supply voltage as a current that constantly flows into L2 from the voltage source during operation of the synchronous full-bridge power oscillator.

If current is flowing through Q3, as determined by the polarity of the sine wave half-cycle at that time, then the conduction to ground from Q2 drain-to-source is pulling charge out of the gate of Q3 and Q1 through forward biased D1. Q1 is also now not conducting and does not pull the gate charge out of Q4 and Q2 to ground through D2. Meanwhile, R1 draws current from the supply voltage. But the IR drop across R1 cannot charge the gate of Q3 and Q1 with the gate shunted to ground by conduction through Q2.

When the sine wave crosses zero, then Q3 becomes reverse biased and conducts through the internal intrinsic diode to reverse-bias D1. D1 stops conducting current away from the Q3 and Q1 gate, and R1 can charge the gate of Q3 and Q1, which stops conduction in Q3 and starts conduction in Q1 to begin conducting current for the continuing sine half-cycle. Q1 also pulls the gate charge out of Q2 and Q4 to ground through D2 and holds Q2 in a non-conducting state, which continues to allow R1 to enhance Q1. And Q4 conducts.

That process repeats as the sine wave alternates polarity, crossing zero in a first direction from negative to positive, and then in a second direction from positive to negative. This generates full-reversal of current in L1, the induction heater coil. Current continues to be replenished in the tank circuit from L2. An IGBT (Insulated Gate Bipolar Transistor) device can replace the N-MOSFET in this embodiment if the intrinsic diode of the N-MOSFET is represented by the addition of an external diode across the drain and source of the IGBT.

Figure 2:
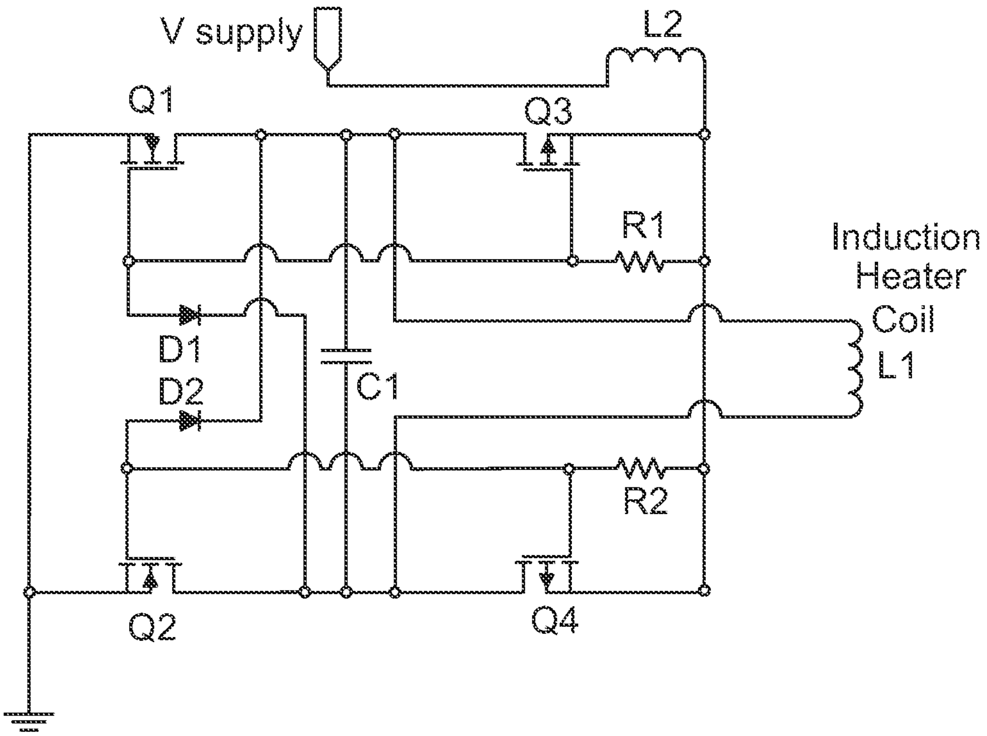
FIG. 2 is a simplified electrical schematic diagram showing a synchronous bridge oscillator with constant-current inductor between full H-bridge and voltage source, and without a transformer and without a center-tap in accordance with embodiments of the invention.

FIG. 1 shows an expanded circuit of cascaded half-bridges that operates in accordance with the principles of operation of the full-bridge as described above and in reference to FIG. 2. Relative to FIG. 2, FIG. 1 shows three additional induction heater coils and three corresponding additional half bridges. In the embodiment shown in FIG. 2, the induction heater coils and the half bridges are arranged such that each induction heater coil, IHC1-IHC4, is driven by a corresponding pair of half bridges, HB1 and HB2 drive IHC1; HB2 and HB3 drive IHC2; HB3 and HB4 drive IHC3; and HB4 and HB5 for IHC4.

The foregoing detailed description is to be understood as being in every respect illustrative and exemplary, but not restrictive, and the scope of the invention disclosed herein is not to be determined from the description of the invention, but rather from the claims as interpreted according to the full breadth permitted by the patent laws. For example, while the synchronized array power oscillator of the invention is described herein driving an induction heater coil for the heater in an internal combustion engine fuel injector, the driver may be used to drive other induction heaters in other applications. It is to be understood that the embodiments shown and described herein are only illustrative of the principles of the present invention and that various modifications may be implemented by those skilled in the art without departing from the scope and spirit of the invention.

The invention claimed is:

1. A synchronized array bridge power oscillator for an electronic induction heater driver, the synchronized array bridge power oscillator comprising:

an H-bridge circuit comprising high-side and low-side semiconductor switches and a resonant tank circuit comprising a tank circuit inductor and tank circuit capacitor, the resonant tank circuit being electrically connected between legs of the H-bridge circuit, the tank circuit inductor configured to be able to inductively heat a fuel injector;

a plurality of half-bridge circuits, each half-bridge circuit comprising high-side and low-side semiconductor switches and a corresponding tank circuit, the plurality of half-bridge circuits being connected in parallel to the H-bridge circuit and connected in parallel to each other, adjacent pairs of half-bridge circuits forming a virtual H-bridge circuit, which is synchronized with the H-bridge circuit;

a plurality of induction heater coils, each induction heater coil being coupled to a corresponding one of the plurality of half-bridge circuits and configured to inductively heat a corresponding fuel injector;

at least one energy replenishment inductor coupled to the resonant tank circuit and to the each of the plurality of half-bridge circuits, the energy replenishment inductor configured to supply energy to the resonant tank circuit and the plurality of half-bridge circuits;

wherein the H-bridge circuit, the half-bridge circuits, and energy replenishment inductor are configured to provide current to a first end of the tank circuit inductor and first end of the induction heater coils during a first half of a sine wave and provide current to an opposite second end of the tank circuit and opposite ends of the induction heater coils during a second half of the sine wave; and wherein half-bridge switch timing is determined by a synchronized frequency of resonant tank circuits in the H-bridge circuit and the half-bridge circuits.

2. The synchronized array bridge power oscillator of claim 1, wherein the energy replenishment inductor is between a voltage source and the high-side switches to source current to the resonant tank circuit from the voltage source.

3. The synchronized array bridge power oscillator of claim 2, wherein the energy replenishment inductor is between a voltage sink and the low-side switches to sink current from the resonant tank circuit to an absolute voltage sink that is less than the voltage source.

4. The synchronized array bridge power oscillator of claim 1, wherein H-bridge synchronization is accomplished through rectifier diodes sinking charge from one leg of a bridge circuit to an opposite leg of a bridge.

5. The synchronized array bridge power oscillator of claim 1, wherein the bridge synchronization is accomplished through resistors sourcing charge from a voltage supply.

6. The synchronized array bridge power oscillator of claim 1, wherein an inductance of the energy replenishment inductor is greater than an inductance of each of the plurality of the induction heater coils.

7. The synchronized array bridge power oscillator of claim 1, wherein an inductance of the energy replenishment inductor is more than twice an inductance value of each of the plurality of the induction heater coils.

8. The synchronized array bridge power oscillator of claim 1, wherein the H-bridge circuit and energy replenishment inductor are configured to provide current to the first end of the tank circuit inductor during a first half of sine wave and provide current to the second end of the tank circuit during a second half of the sine wave, the first and second sine waves being defined by the sine wave polarity.

9. The synchronized array bridge power oscillator of claim 1, wherein the tank circuit inductor and a tank circuit capacitor are connected in parallel to each other.

10. The synchronized array bridge power oscillator of claim 1, wherein the tank circuit inductor is a single coil and wherein each coil of the plurality of induction heater coils are single coils, each coil being configured to provide induction heating for a corresponding fuel injector.

* * * * *